(12) United States Patent
Koui

(10) Patent No.: US 7,848,063 B2
(45) Date of Patent: Dec. 7, 2010

(54) YOKE-TYPE MAGNETIC HEAD AND MAGNETIC DISK APPARATUS

(75) Inventor: Katsuhiko Koui, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 825 days.

(21) Appl. No.: 11/812,933

(22) Filed: Jun. 22, 2007

(65) Prior Publication Data

US 2008/0002294 A1 Jan. 3, 2008

(30) Foreign Application Priority Data

Jun. 30, 2006 (JP) .............................. 2006-182424

(51) Int. Cl.
*G11B 5/39* (2006.01)
(52) U.S. Cl. ..................................... 360/321
(58) Field of Classification Search ................. 360/317, 360/318, 321, 322
See application file for complete search history.

(56) References Cited

U.S. PATENT DOCUMENTS

| | | | | |
|---|---|---|---|---|
| 4,356,523 A * | 10/1982 | Yeh | ............................. | 360/315 |
| 4,740,855 A | 4/1988 | Diepers et al. | | |
| 5,027,246 A | 6/1991 | Numazawa et al. | | |
| 5,164,869 A * | 11/1992 | Fontana et al. | ............... | 360/318 |
| 6,665,152 B2 * | 12/2003 | Nemoto | ....................... | 360/319 |
| 7,140,094 B2 * | 11/2006 | Nemoto | .................... | 29/603.14 |
| 7,170,719 B1 * | 1/2007 | Dovek et al. | ................. | 360/317 |
| 7,403,359 B1 * | 7/2008 | Nibarger et al. | .......... | 360/324.1 |
| 7,616,411 B2 * | 11/2009 | Gill | ........................ | 360/324.12 |

FOREIGN PATENT DOCUMENTS

| JP | 6-119619 | 4/1994 |
|---|---|---|
| JP | 2001-256608 | 9/2001 |

* cited by examiner

*Primary Examiner*—Angel A. Castro
(74) *Attorney, Agent, or Firm*—Pillsbury Winthrop Shaw Pittman, LLP

(57) ABSTRACT

According to one embodiment, a yoke-type magnetic head for reading out magnetic information from a medium in which information is magnetically recorded in a track direction, the head includes a magnetic pole which is provided on a plane perpendicular to a linear recording direction and has an opposing surface facing the medium, a saturation magnetic flux density Bs1, and a volume V1, a sub yoke which is formed on the plane by being connected to the magnetic pole, and has a length SYW in a direction perpendicular to the linear recording direction longer than a length SYH in a direction perpendicular to a surface of the medium, and a saturation magnetic flux density Bs2 and a volume V2, the product Bs2V2 of which is larger than the product Bs1V1, and a magnetoresistance effect film which is formed between the sub yoke and the opposing surface, and abuts the magnetic pole.

10 Claims, 6 Drawing Sheets

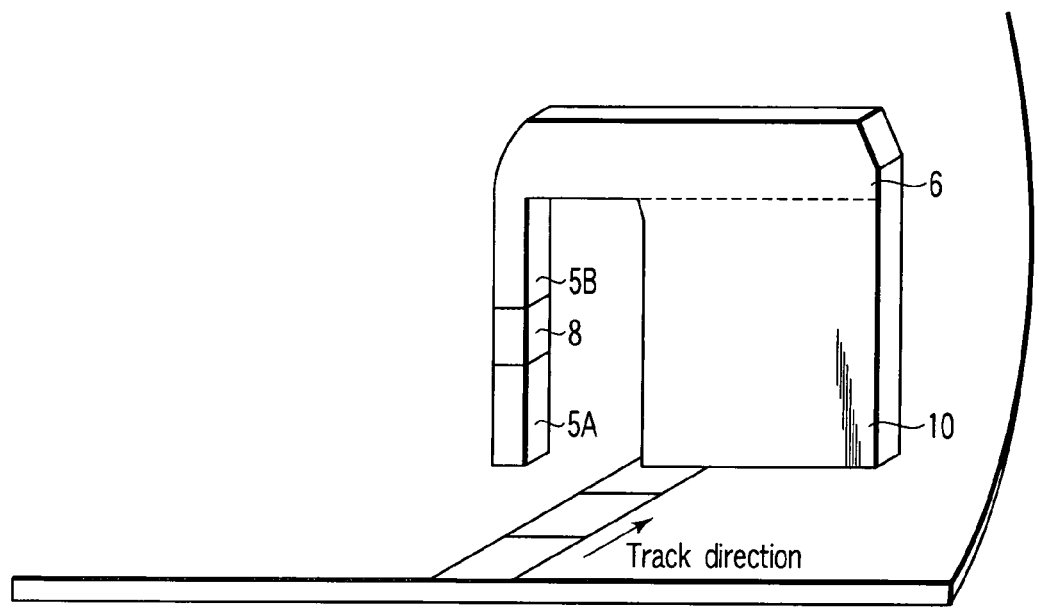
F I G. 12
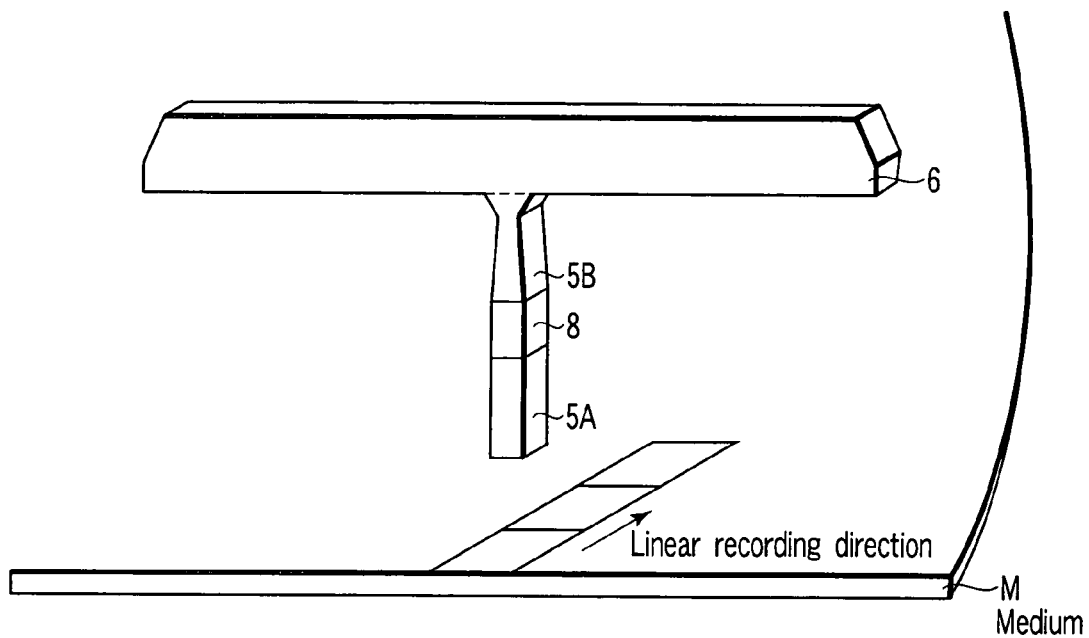
F I G. 13

# YOKE-TYPE MAGNETIC HEAD AND MAGNETIC DISK APPARATUS

CROSS-REFERENCE TO RELATED APPLICATIONS

This application is based upon and claims the benefit of priority from Japanese Patent Application No. 2006-182424, filed Jun. 30, 2006, the entire contents of which are incorporated herein by reference.

BACKGROUND

1. Field

One embodiment of the invention relates to a yoke-type magnetic head and a magnetic disk apparatus therefor.

2. Description of the Related Art

A next-generation magnetoresistance effect element faces problems such as a narrowed gap and a free layer soft magnetic properties, while a resistance change rate has been improved. In order to solve these problems, a yoke-type magnetic head has been proposed (Jpn. Pat. Appln. Publication No. 2001-256608).

However, there has been a problem that the yoke-type magnetic head has difficulty in determining a signal due to Barkhausen noise.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 12 is an exemplary perspective view showing a configuration of a yoke-type magnetic head according to a second embodiment; and FIG. 13 is an exemplary perspective view showing a modification example of a yoke-type magnetic head.

DETAILED DESCRIPTION

Various embodiments according to the invention will be described hereinafter with reference to the accompanying drawings. In general, according to one embodiment of the invention, a yoke-type magnetic head for reading out magnetic information from a medium in which information is magnetically recorded in a track direction, the head comprises a main magnetic pole which is provided on a plane perpendicular to a linear recording direction and has an opposing surface facing the medium, a saturation magnetic flux density Bs1, and a volume V1, a sub yoke which is formed on the plane by being connected to the main magnetic pole, and has a length SYW in a direction perpendicular to the linear recording direction longer than a length SYH in a direction perpendicular to a main surface of the medium, and a saturation magnetic flux density Bs2 and a volume V2, the product Bs2V2 of which is larger than the product of the saturation magnetic flux density Bs1 and the volume V1, and a magnetoresistance effect film which is formed between the sub yoke and the opposing surface, and abuts the main magnetic pole.

First Embodiment

Figure 1:
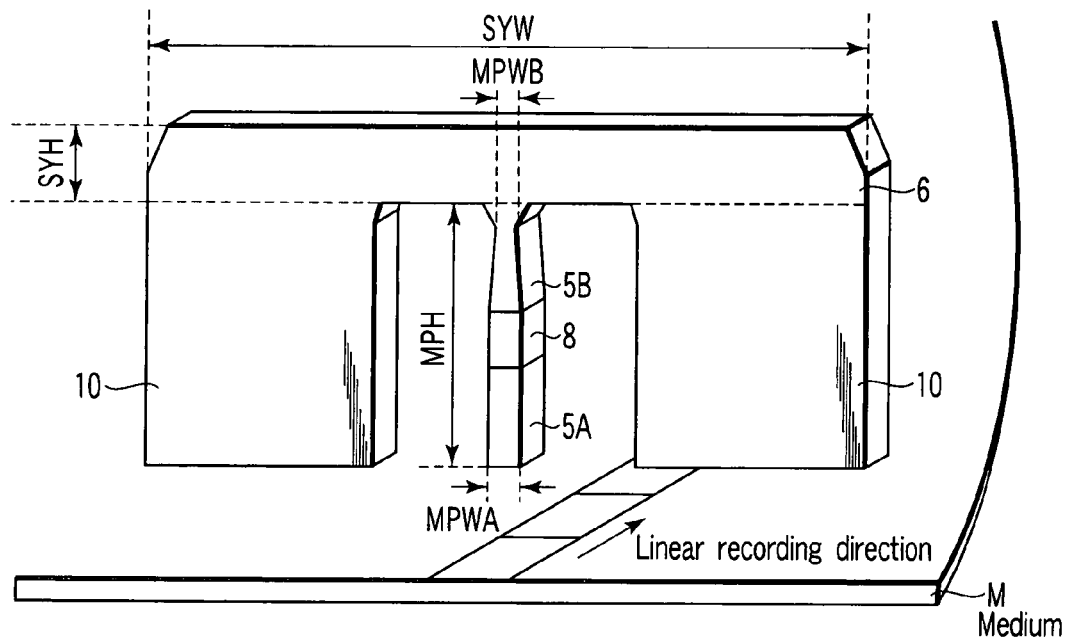
FIG. 1 is an exemplary perspective view showing a schematic configuration of a yoke-type reproducing magnetic head according to a first embodiment.
Figure 2:
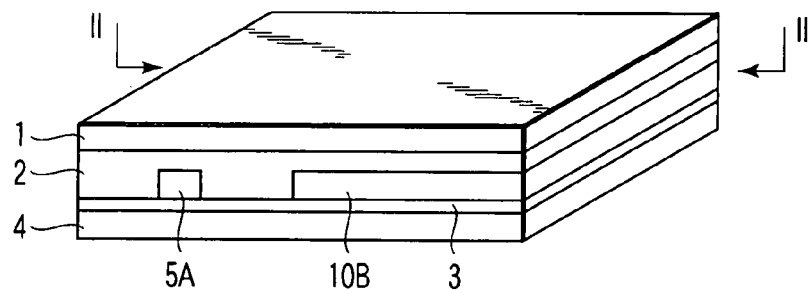
FIG. 2 is an exemplary perspective view of a configuration of the yoke-type magnetic head shown in FIG. 1.
Figure 3:
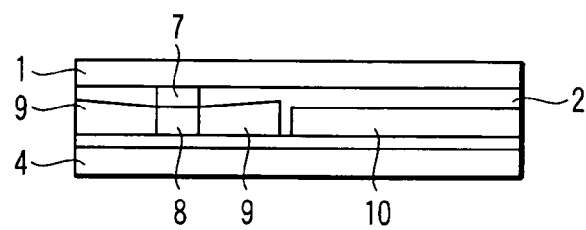
FIG. 3 is an exemplary cross-sectional view showing a configuration of the yoke-type magnetic head shown in FIG. 2.

A configuration of a yoke-type reproducing magnetic head according to a first embodiment of the present invention will be described with reference to FIGS. 1, 2, and 3. FIG. 1 is a schematic view showing the magnetic head according to the first embodiment of the present invention. In addition, FIG. 2 is a perspective view showing a configuration of the magnetic head. FIG. 3 is a cross-sectional view of the magnetic head shown in FIG. 2 cut along the line II-II. In FIG. 2, a cross section on a front side in the figure shows an air bearing surface (ABS).

As shown in FIG. 1, main magnetic poles 5A and 5B which introduce a signal magnetic field from a medium in a magnetoresistance effect film, a sub yoke 6 for returning a magnetic field flowing into the main magnetic poles, and a side shield 10 are formed in a plane perpendicular to a linear recording direction of the medium. That is, the sub yoke 6 is formed in an off-track direction with respect to the main magnetic poles 5A and 5B. The main magnetic poles 5A and 5B have a first main magnetic pole region 5A having an opposing surface facing the medium and a second main magnetic pole region 5B connected to the sub yoke 6. A magnetoresistance effect film 8 is formed between the first main magnetic pole region 5A and the second main magnetic pole region 5B, and is formed in a way interrupting in the middle of the main magnetic pole. A part of the second main magnetic pole region 5B has a width in a direction crossing the linear recording direction at a right angle which is shorter than a length of an ABS (opposing surface) of the first main magnetic pole region 5A facing the medium in a direction crossing the linear recording direction at a right angle.

The sub yoke 6 is provided for the purpose of flowing magnetic flux so that a magnetic domain is not generated at the far rear end of the second main magnetic pole region 5B.

The side shield 10 is connected to the sub yoke 6 and is formed on each of both sides of the main magnetic poles 5A and 5B, and the magnetoresistance effect film 8. The side shield 10 blocks a magnetic field from an adjacent track entering into the main magnetic pole in order to correspond to even higher recording density. The side shield is not on a recording track in a magnetic recording apparatus, but is formed in an off-track direction in a manner separated from upper and lower shields.

As shown in FIG. 2, the magnetoresistance effect film 8 is not substantially exposed magnetically on the ABS. The main magnetic pole 5A is configured to directly read a signal magnetic field of a medium M and transmit the signal magnetic field to the magnetoresistance effect film 8. As shown in FIGS. 2 and 3, a conductive space layer 3 is formed on a lower shield electrode 4. On the conductive space layer 3, the main magnetic poles 5A and 5B, the magnetoresistance effect film 8, and a hard magnet 9 are formed. An insulating layer 2 is formed so as to cover the main magnetic poles 5A and 5B, the magnetoresistance effect film 8, and the hard magnet 9 on the lower shield electrode 4. The insulating layer 2 is formed on the conductive space layer 3. An upper pillar 7 is formed in a hole to be connected to the magnetoresistance effect film 8 provided in the insulating layer 2. An upper shield electrode 1 is formed on the upper pillar 7 and the insulating layer 2.

An area of the side shield exposing to the ABS needs to be larger than that of the main magnetic pole. If the area is small, an influx magnetic field cannot flow back sufficiently. Thereby, not only Barkhausen noise, but also inflow of noise from the sub yoke is generated.

As shown in FIG. 1, the magnetoresistance effect film is formed to interrupt in the middle of the main magnetic pole 5. In this manner, magnetic flux introduced in the main magnetic pole 5 efficiently flows in the magnetoresistance effect film 8. The hard magnet 9 is formed on a side surface of the magnetoresistance effect film 8. The hard magnet 9 is formed to apply vertical bias to the magnetic field flowing into the magnetoresistance effect film from the medium. By applying the vertical bias to the influx magnetic field, an output from which polarity of the influx magnetic field can be identified can be obtained.

Films such as a giant magnetoresistance spin valve film (hereinafter GMR-SV), a tunnel magnetoresistance effect film (hereinafter TMR), and a ballistic magnetoresistance effect film (hereinafter BMR) are generally used as the magnetoresistance effect film. The GMR-SV is further classified into an in-plane electrification type (CIP-GMR-SV) and a vertical electrification type (CPP-GMR-SV). FIG. 3 shows a case where the CPP-GMR-SV, the TMR, and the BMR are used. For this reason, the upper pillar 7 is provided to maintain conductivity with an upper electrode. This is not required when the CIP-GMR-SV is used. Further, the conductive space layer 3 is replaced by the insulating layer, and an electrode is formed on a side surface of CIP-GMR-SV.

A magnetic domain is desirably made to be hardly generated in the vicinity of a connecting part of the main magnetic pole and the sub yoke in order to restrict Barkhausen noise. In a case of the present magnetic sensor, since the main magnetic pole and the sub yoke are formed on the same plane, an acute bend of a magnetic circuit as found in the prior art can be avoided. Therefore, an unstable magnetic domain is hardly generated, and as a result thereof, influence of Barkhausen noise to the main magnetic pole can be reduced.

In addition, since the second main magnetic pole region of the main magnetic pole and the sub yoke are configured with one magnetic material film, the connecting part of the main magnetic pole and the sub yoke can be made to be continuous and generation of a magnetic domain can be restricted.

In addition, forming smooth shapes of the main magnetic pole, the sub yoke, the side shield, and connecting parts thereof shown in FIG. 1 viewed from a direction in the figure is important for controlling a magnetic domain. According to the present embodiment, patterning can be carried out from a laminated surface of a return yoke, therefore a desired shape can be easily formed in view of the process.

That is, after a magnetic layer is formed, the main magnetic pole, the sub yoke, and the side shield can be formed at once by one time of reticle formation by photolithography and milling. In addition, since the shape at that time is formed by patterning of reticle, the shape has a high degree of freedom. In the conventional art, the film formation, the reticle formation, and the milling are necessary at least for once for each of the main magnetic pole and the return yoke, therefore the number of steps is more than double. Further, virtually there is almost no adjusting margin in the shape of the connecting part of the main magnetic pole and the return yoke, therefore controlling of a magnetic domain is difficult.

Further, since a width SYW of the sub yoke 6 is made longer than a height SYH of the sub yoke 6, anisotropy is applied to the shape of the sub yoke 6. Thereby, flow of magnetic flux in the sub yoke can be limited to one axis. In this manner, a degree of freedom in a direction of the magnetic flux is limited, thereby generation of a magnetic domain can be significantly reduced. In addition, the direction of the magnetic flux of the sub yoke 6 needs to be stable with respect to an influence from the main magnetic pole as much as possible. For this reason, the product Bs2V2 of a saturated magnetic flux density Bs2 of the sub yoke 6 and a volume V2 of the sub yoke needs to be larger than the product Bs1V1 of a saturated magnetic flux density Bs1 of the main magnetic pole and a volume V1 of the main magnetic pole.

In addition, in order to obtain uniaxial anisotropy in the SYW direction, a bias film can actively be formed. Specifically, a hard magnetic film is laminated. However, significant hard magnetism affects flow of the magnetic flux in the main magnetic pole, and is not desirable. Specifically, $(4\pi)^{-1}$ MA/m (1 kOe) or less is desirable. In addition, one-direction anisotropy may be applied by using an antiferromagnetic layer.

In order to efficiently transmit magnetic flux from a medium to the magnetoresistance effect film 8, the magnetic flux can be concentrated and transmitted when the second main magnetic pole region 5B becomes thinner from a surface of the medium toward a far end. Specifically, although the magnetic flux is concentrated in inverse proportion to a cross-sectional area of the main magnetic pole, a part of the main magnetic pole where the cross-sectional area is made significantly thinner forms a magnetic domain and does not allow the magnetic flux passing through the main magnetic pole. For this reason, a width MPWB of the narrowed part is desirably larger than 1/10 of a width MPWA of the ABS.

The magnetic head shown in FIG. 1 can be integrated into a magnetic head assembly of a recording and reproducing integrated type to be mounted in a magnetic recording and reproducing apparatus.

Figure 4:
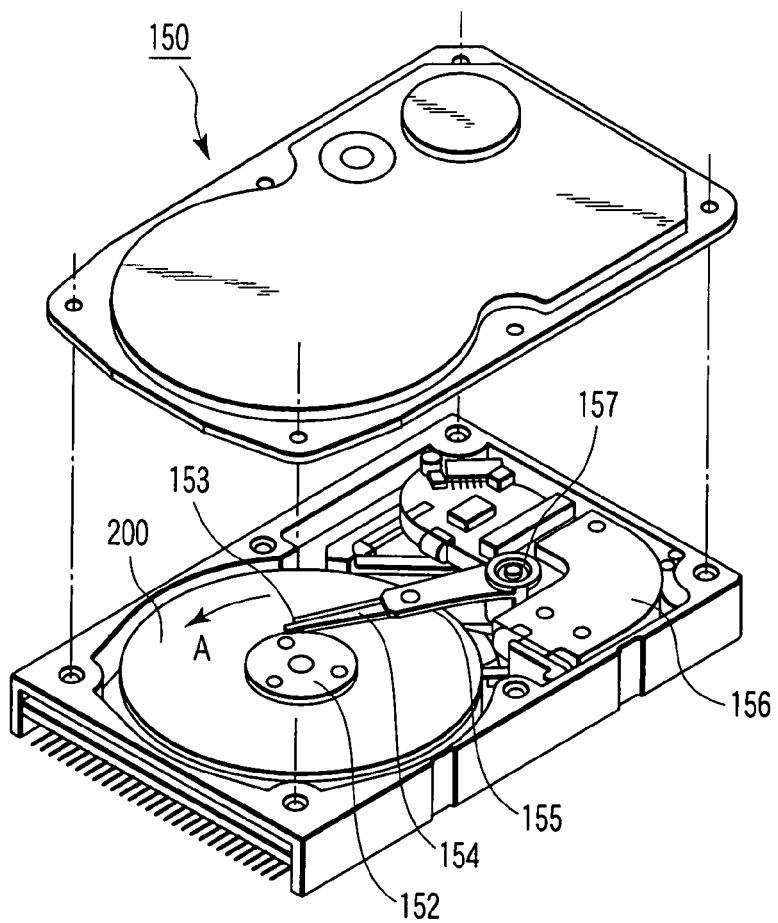
FIG. 4 is an exemplary perspective view showing a magnetic recording and reproducing apparatus according to an embodiment of the present invention.

FIG. 4 is a perspective view of main parts exemplifying a schematic configuration of the magnetic recording and reproducing apparatus as described above. That is, a magnetic recording and reproducing apparatus 150 of the present embodiment of the invention is a apparatus using a rotary actuator. In FIG. 4, a magnetic disk 200 is mounted in a spindle 152, and is rotated by a motor (not shown) responding to a control signal from a driving apparatus controlling unit (not shown) in a direction of an arrow A. The magnetic recording and reproducing apparatus 150 in the present embodiment of the invention may be one which includes a plurality of magnetic disks 200.

A head slider 153 for carrying out recording and reproducing of information to be stored in the magnetic disk 200 is attached to a front edge of a suspension 154. The head slider 153 has the magnetic head including the yoke-type reproducing magnetic head described above and a recording magnetic head mounted in the vicinity of the front edge thereof.

When the magnetic disk 200 rotates, a surface of the head slider 153 facing the medium (ABS) is held with a predetermined floating quantity from a front surface of the magnetic disk 200. Alternatively, the configuration may be a so-called "running-in-contact type" where the slider is in contact with the magnetic disk 200.

The suspension 154 is connected to one end of an actuator arm 155 which has a bobbin unit for holding a drive coil (not shown), etc. On the other end of the actuator arm 155, there is provided a voice coil motor 156 which is one type of a linear motor. The voice coil motor 156 is configured with a drive coil (not shown) wound up in the bobbin unit of the actuator arm 155 and a magnetic circuit including a permanent magnet and an opposing yoke which are arranged to face each other with the coil interposed therebetween.

The actuator arm 155 is held by a ball bearing (not shown) provided in two positions on the top and bottom of a spindle 157, and is made to freely rotate and slide by the voice coil motor 156.

Figure 5:
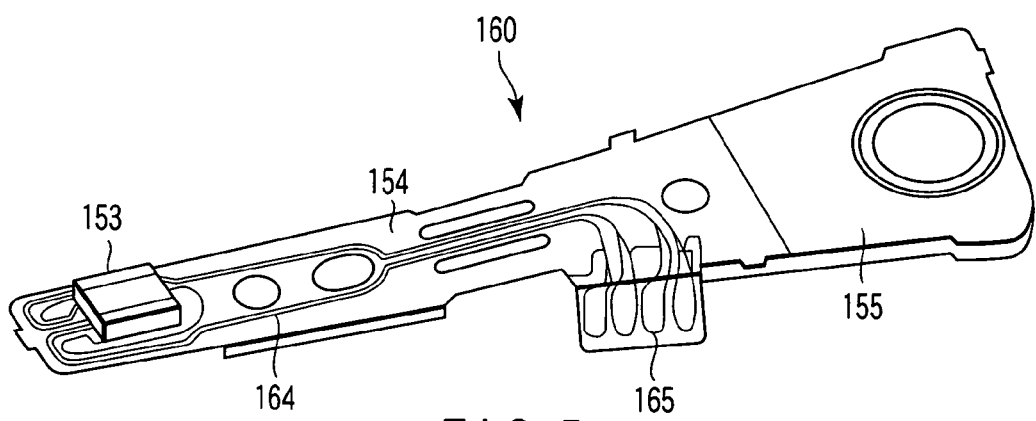
FIG. 5 is an exemplary perspective view of a magnetic head assembly according to an embodiment of the present invention.

FIG. 5 is an enlarged perspective view of the magnetic head assembly which is extending from the actuator arm 155 viewed from a disk side. That is, a magnetic head assembly 160 has the actuator arm 155 which, for example, has the bobbin unit for holding the drive coil, and the suspension 154 is connected to one end of the actuator arm 155.

At the front edge of the suspension 154, the head slider 153 including the magnetic head described above is attached. The suspension 154 has a lead wire 164 for writing and reading a signal, and the lead wire 164 and each electrode of the magnetic head incorporated in the head slider 153 are electrically connected. In FIG. 5, the numerical number 165 denotes an electrode pad of the magnetic head assembly 160.

By including the reproducing magnetic head described above, information magnetically recorded in the magnetic disk 200 can surely be read with a recording density higher than the prior art.

FIGS. 6, 7, 8, 9, 10, and 11 show configurations of application examples similar to the embodiments which have been described so far. FIG. nA is a cross-sectional view of the ABS, and FIG. nB is a cross-sectional view of a part corresponding to FIG. 3 (n=6, 7, 8, 9, 10, and 11).

Figure 6A:
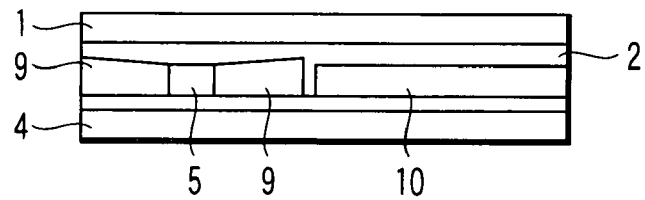
FIG. 6A and FIG. 6B are exemplary cross-sectional views showing a configuration of the yoke-type magnetic head according to the first embodiment.
Figure 6B:
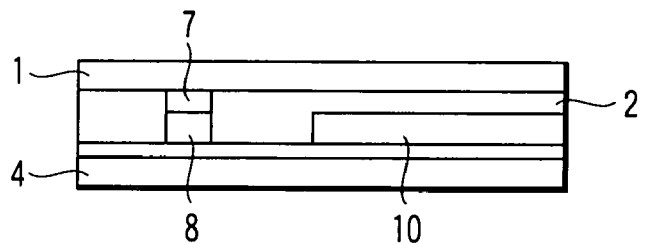

As shown in FIGS. 6A and 6B, the hard magnet 9 is not formed on a side part of the magnetoresistance effect film 8, and is formed on a side part of the first main magnetic pole region 5A in the ABS surface. In this case, an influx magnetic field is weakened, however, an efficiency is high in the vicinity of the magnetoresistance effect film on the contrary. Therefore, as a result, an output equivalent to the structure shown in FIGS. 2 and 3 is obtained.

Figure 7A:
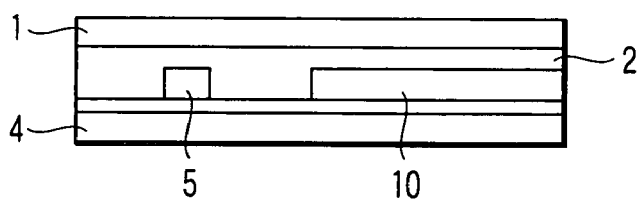
FIG. 7A and FIG. 7B are exemplary cross-sectional views showing a configuration of the yoke-type magnetic head according to the first embodiment.
Figure 7B:
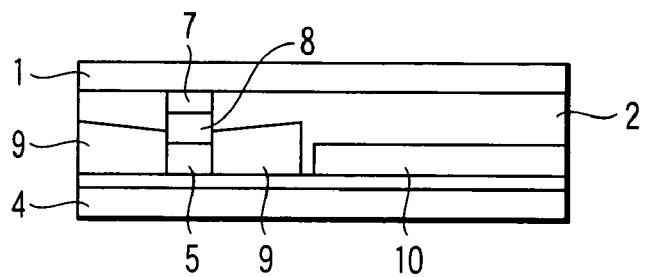

In a structure shown in FIGS. 7A and 7B, the magnetoresistance effect film 8 does not interrupt the main magnetic pole as shown in the structure shown in FIGS. 2 and 3, and is formed on the main magnetic pole 5. In a case of this structure, although a wafer process is simplified, a magnetic flux flowing efficiency is reduced in the magnetoresistance effect film. However, when a material having a large magnetic resistance effect is used, the reduced efficiency is compensated and an output can be obtained. Therefore, a merit of the process simplification can be prioritized.

Figure 8A:
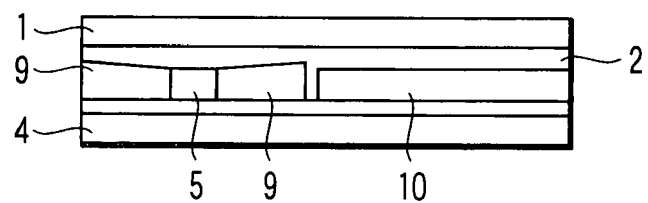
FIG. 8A and FIG. 8B are exemplary cross-sectional views showing a configuration of the yoke-type magnetic head according to the first embodiment.
Figure 8B:
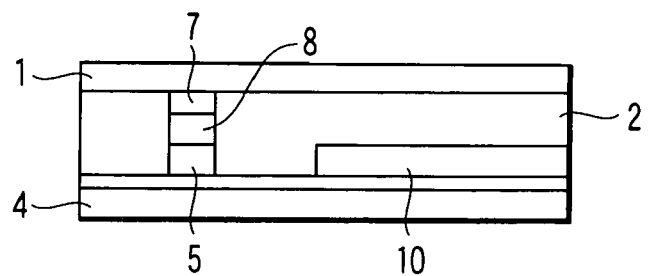

In FIGS. 8A and 8B, the magnetoresistance effect film 8 does not interrupt the main magnetic pole and is formed on the main magnetic pole 5, similar to the structure shown in FIGS. 7A and 7B. Further, similar to the structure shown in FIG. 6, the hard magnet is formed on the ABS. An effect of the structure in FIGS. 8A and 8B is similar to the structure shown in FIG. 7.

FIGS. 9A and 9B, FIGS. 10A and 10B and FIGS. 11A and 11B show a structure used for applying a perpendicular bias to a main pole 5 or a magnetoresistance effect film 8. As shown, the structure includes a layer 11 formed of an antiferromagnetic material or a hard magnetic material. Since this structure does not necessarily require the hard magnet 9, the space between the side shield 10 and the main magnetic pole 5 can be designed with a high degree of freedom.

Figure 9A:
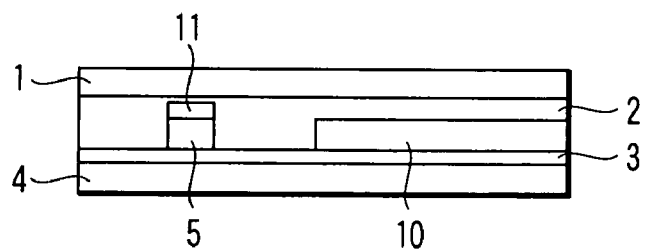
FIG. 9A and FIG. 9B are exemplary cross-sectional views showing a configuration of the yoke-type magnetic head according to the first embodiment.
Figure 9B:
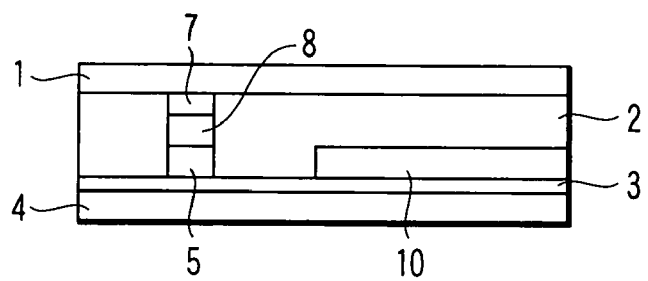
Figure 10A:
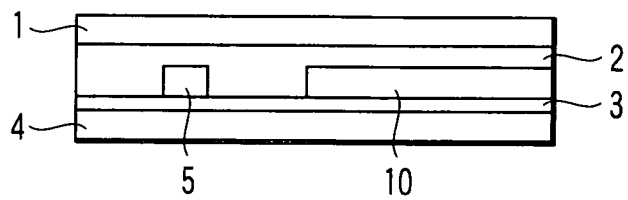
FIG. 10A and FIG. 10B are exemplary cross-sectional views showing a configuration of the yoke-type magnetic head according to the first embodiment.
Figure 10B:
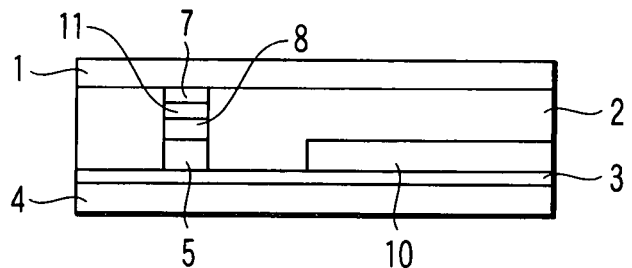
Figure 11A:
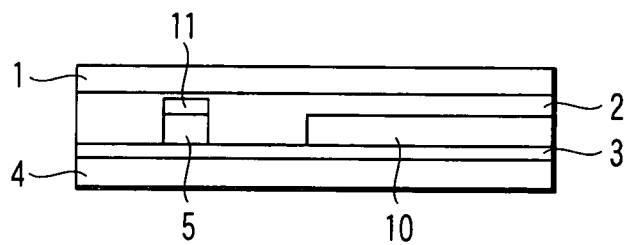
FIG. 11A and FIG. 11B are exemplary cross-sectional views showing a configuration of the yoke-type magnetic head according to the first embodiment.
Figure 11B:
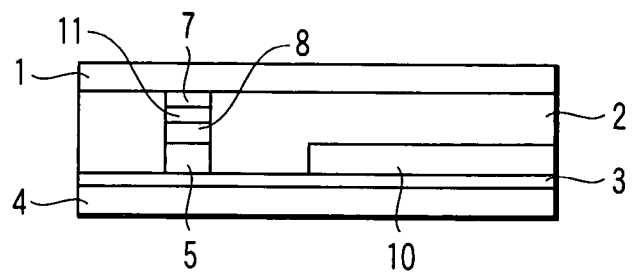

The layer 11 may be formed on the main magnetic pole 5 at a position in the neighborhood of the ABS, as shown in FIGS. 9A and 9B. Alternatively, the layer 11 may be formed between the antiferromagnetic effect-film 8 and the upper pillar 7, as shown in FIGS. 10A and 10B. As a more magnetically stable structure, the layer 11 may be formed on both the main magnetic pole 5 and the magnetoresistance effect film 8, as shown in FIGS. 11A and 11B.

In the structures shown in FIGS. 8A and 8B, FIGS. 10A and 10B and FIGS. 11A and 11B, the magnetoresistance effect film 8 is stacked on the main magnetic pole 5. As described with reference to FIGS. 3 and 6, the magnetoresistance effect film 8 may be formed in such a manner as to divide the main magnetic pole 5.

Second Embodiment

A second embodiment of the present invention has a structure in which the side shield is formed only on one side of the main magnetic pole, as shown in FIG. 12. In this case as well, as compared with the structure shown in FIG. 1, there is a lower degree of freedom in design, however, almost equivalent effect can be obtained.

Third Embodiment

A third embodiment of the present invention is characterized in that the main magnetic pole itself is made of a magnetization free layer of the magnetoresistance effect film in FIG. 5. In this manner, a magnetic flux flowing efficiency can be further increased. In this case, a rear part of the main magnetic pole may abut and is bonded with another magnetic layer, or the entire main magnetic pole as far as the return yoke may be made of the magnetization free layer. In addition, this structure is applicable to the structure shown in FIGS. 6A and 6B, or can obtain an advantageous effect by the structure shown in FIG. 7.

In the examples shown above, the structures in which the side shield is formed on sides of the main magnetic poles 5A and 5B are shown. However, as shown in FIG. 13, the side shield may not be formed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A yoke-type magnetic head for reading out magnetic information from a medium in which information is magnetically recorded in a track direction, the head comprising:

a main magnetic pole which is provided on a plane perpendicular to a linear recording direction and has an opposing surface facing the medium, a saturation magnetic flux density Bs1, and a volume V1;

a sub yoke which is formed on the plane by being connected to the main magnetic pole, and has a length SYW in a direction perpendicular to the linear recording direction longer than a length SYH in a direction perpendicular to a main surface of the medium, and a saturation magnetic flux density Bs2 and a volume V2, the product Bs2V2 of which is larger than the product of the saturation magnetic flux density Bs1 and the volume V1; and a magnetoresistance effect film which is formed between the sub yoke and the opposing surface, and abuts the main magnetic pole.

2. The yoke-type magnetic head according to claim 1, further comprising a side shield connected to the sub yoke in the plane and formed on a side of the main magnetic pole.

3. The yoke-type magnetic head according to claim 1, wherein the main magnetic pole and the sub yoke are formed in one magnetic material film.

4. The yoke-type magnetic head according to claim 1, wherein the sub yoke has magnetic anisotropy where a direction perpendicular to the linear recording direction is an easy axis of magnetization.

5. The yoke-type magnetic head according to claim 1, wherein a length of the main magnetic pole between a portion of the main magnetic pole where the magnetoresistance effect film abuts and the sub yoke in a direction perpendicular to the linear recording direction of the main magnetic pole is shorter than a length of the opposing surface in a direction perpendicular to the linear recording direction.

6. A magnetic disk apparatus having a yoke-type magnetic head for reading out magnetic information from a medium in which information is magnetically recorded in a linear recording direction, wherein the yoke-type magnetic head comprises: a main magnetic pole which is formed on a plane extending from a medium to which information is magnetically recorded in a linear recording direction and perpendicular to a surface of the medium, and also perpendicular to the linear recording direction, and has an opposing surface facing the medium, a saturation magnetic flux density Bs1, and a volume V1; a sub yoke which is formed on the plane by being connected to the main magnetic pole, and has a length SYW in a direction perpendicular to the linear recording direction longer than a length SYH in a direction perpendicular to a main surface of the medium, and a saturation magnetic flux density Bs2 and a volume V2, the product Bs2V2 of which is larger than the product of the saturation magnetic flux density Bs1 and the volume V1; and a magnetoresistance effect film which is formed between the sub yoke and the opposing surface, and abuts the main magnetic pole.

7. The magnetic disk apparatus according to claim 6, further comprising a side shield connected to the sub yoke in the plane and formed on a side of the main magnetic pole.

8. The magnetic disk apparatus according to claim 6, wherein the main magnetic pole and the sub yoke are formed in one magnetic material film.

9. The magnetic disk apparatus according to claim 6, wherein the sub yoke has magnetic anisotropy where a direction perpendicular to the linear recording direction is an easy axis of magnetization.

10. The magnetic disk apparatus according to claim 6, wherein a length of the main magnetic pole between a portion of the main magnetic pole where the magnetoresistance effect film abuts and the sub yoke in a direction perpendicular to the linear recording direction of the main magnetic pole is shorter than a length of the opposing surface in a direction perpendicular to the linear recording direction.

* * * * *